United States Patent
Shen et al.

(10) Patent No.: US 12,148,758 B2
(45) Date of Patent: Nov. 19, 2024

(54) ARRAY SUBSTRATE AND MANUFACTURING METHOD AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Haiyan Shen, Hubei (CN); Hui Zheng, Hubei (CN); Can Huang, Hubei (CN); Wenxu Xianyu, Hubei (CN); Chunpeng Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/618,463

(22) PCT Filed: Nov. 26, 2021

(86) PCT No.: PCT/CN2021/133535
§ 371 (c)(1),
(2) Date: Dec. 11, 2021

(87) PCT Pub. No.: WO2023/082350
PCT Pub. Date: May 19, 2023

(65) Prior Publication Data
US 2024/0014216 A1 Jan. 11, 2024

(30) Foreign Application Priority Data
Nov. 15, 2021 (CN) .......................... 202111348333.X

(51) Int. Cl.
*H01L 27/12* (2006.01)
*H01L 25/075* (2006.01)
(Continued)

(52) U.S. Cl.
CPC ...... *H01L 27/1222* (2013.01); *H01L 25/0753* (2013.01); *H01L 25/167* (2013.01);
(Continued)

(58) Field of Classification Search
CPC .......................... H01L 25/167; H01L 25/0753
See application file for complete search history.

(56) References Cited

U.S. PATENT DOCUMENTS

| 2006/0175609 A1* | 8/2006 | Chan ................. H01L 29/78696 438/149 |
| 2018/0102383 A1 | 4/2018 | Kim et al. |

(Continued)

FOREIGN PATENT DOCUMENTS

| CN | 103730508 A | 4/2014 |
| CN | 105514173 A | 4/2016 |

(Continued)

OTHER PUBLICATIONS

International Search Report in International application No. PCT/CN2021/133535,mailed on Jul. 6, 2022.
Written Opinion of the International Search Authority in International application No. PCT/CN2021/133535,mailed on Jul. 6, 2022.
Chinese Office Action issued in corresponding Chinese Patent Application No. 202111348333.X dated Jan. 28, 2023, pp. 1-5.

*Primary Examiner* — Jae Lee
(74) *Attorney, Agent, or Firm* — PV IP PC; Wei Te Chung

(57) ABSTRACT

An array substrate and a manufacturing method thereof, and a display panel are provided. A first thin film transistor includes a first electrode, a second electrode, a first active pattern, and a first gate electrode. The first active pattern extends in a thickness direction of the array substrate. The first gate extends in the thickness direction of the array (Continued)

substrate. At least two of first sidewalls of the first electrode of the first thin film transistor and at least two second sidewalls of the second electrode of the first thin film transistor are disposed surround a first opening which penetrating the first thin film transistor.

17 Claims, 7 Drawing Sheets

(51) Int. Cl.
*H01L 25/16* (2023.01)
*H01L 33/38* (2010.01)
*H01L 33/62* (2010.01)

(52) U.S. Cl.
CPC .......... *H01L 27/127* (2013.01); *H01L 33/382* (2013.01); *H01L 33/62* (2013.01); *H01L 2933/0016* (2013.01)

(56) References Cited

U.S. PATENT DOCUMENTS

| | | | |
|---|---|---|---|
| 2019/0019896 A1* | 1/2019 | Shi | H01L 29/78618 |
| 2021/0210528 A1* | 7/2021 | Qu | H01L 21/28 |
| 2022/0216287 A1* | 7/2022 | You | H10K 71/421 |

FOREIGN PATENT DOCUMENTS

| | | |
|---|---|---|
| CN | 106328658 A | 1/2017 |
| CN | 106910778 A | 6/2017 |
| CN | 106953011 A | 7/2017 |
| CN | 107221501 A | 9/2017 |
| CN | 109873025 A | 6/2019 |

\* cited by examiner

ARRAY SUBSTRATE AND MANUFACTURING METHOD AND DISPLAY PANEL

FIELD OF INVENTION

The present application relates to display technologies, and more particularly, to an array substrate and manufacturing method thereof and display panel.

BACKGROUND OF INVENTION

In recent years, high-resolution display devices have been a development trend in the display technologies. A pixel per inch (PPI) of the display panel is related to a pixel aperture ratio of the array substrate. A pixel aperture ratio of the array substrate is related to a size of the thin film transistor and a number of thin film transistors per unit area. The larger the area occupied by the thin film transistor, the lower the pixel aperture ratio and the lower the resolution of the display panel. However, due to the limitation of the process line width and wiring of thin film transistors, a development of high-resolution display devices is restricted.

Therefore, it is necessary to propose a technical solution to improve the PPI of the display device.

SUMMARY OF INVENTION

A purpose of the present application is to provide an array substrate, a manufacturing method thereof, and a display panel, which are beneficial to improve a resolution (pixel per inch (PPI)) of the display panel.

An array substrate, including:
a substrate; and
a first thin film transistor layer disposed on the substrate, and the first thin film transistor layer includes:
   a plurality of first thin film transistors disposed at intervals, wherein each of the first thin film transistors includes:
   a first electrode having a first sidewall;
   a second electrode having a second sidewall;
   a first active pattern extending in a thickness direction of the array substrate; and
   a first gate electrode extending in the thickness direction of the array substrate and positioned at a side of the first active pattern away from the first electrode and the second electrode in the thickness direction of the array substrate; and
   at least one first opening penetrating the first thin film transistor layer;
   wherein the first electrodes and the second electrodes of at least two of the first thin film transistors are disposed around one first opening, and each of the first openings includes at least two of first sidewalls of the first electrode of the first thin film transistor and at least two second sidewalls of the second electrode of the first thin film transistor.

A display panel, including the array substrate and a light-emitting element, wherein the light-emitting element is electrically connected to at least one of the first thin film transistors.

A method of manufacturing the array substrate, wherein the method includes the following steps:
   providing a first electrode layer and a second electrode layer on the substrate;
   providing at least one opening penetrating the first electrode layer and the second electrode layer, wherein the opening comprises a first annular sidewall of the first electrode layer and a second annular sidewall of the second electrode layer;
   providing a patterned semiconductor layer at least on the first annular sidewall of the first electrode layer, the second annular sidewall of the second electrode layer, and the substrate;
   providing at least two spaced-apart first gate electrodes corresponding to one of the openings on a surface of the patterned semiconductor layer away from the first electrode layer and the second electrode layer, and wherein part of at least two spaced disposed first gate electrodes which corresponding to one opening is position in the opening;
   providing at least two disconnected portions penetrating the patterned semiconductor layer, the first electrode layer, and the second electrode layer, and wherein each of the disconnected portions is positioned between two adjacent first gate electrodes provided corresponding to one first opening, and wherein at least two of the disconnected portions are in communication with the opening, and at least two of the disconnected portions disconnecting the patterned semiconductor layer, the first electrode layer, and the second electrode layer into at least two of the first active patterns, at least two of the first electrodes, and at least two of the second electrodes respectively.

The present application provides an array substrate a manufacturing method thereof, and a display panel. A first thin film transistor includes a first electrode having a first sidewall, a second electrode having a second sidewall, a first active pattern, and a first gate electrode. The first active pattern extends in a thickness direction of the array substrate. The first gate electrode extends in the thickness direction of the array substrate and is positioned on a side of the first active pattern away from the first electrode and the second electrode in the thickness direction of the array substrate. At least two of first sidewalls of the first electrode of the first thin film transistor and at least two second sidewalls of the second electrode of the first thin film transistor are disposed surround a first opening which penetrating the first thin film transistor. The present application makes the vertical first thin film transistor disposed in an array, by combining the advantages of vertical thin film transistors that occupy a small horizontal space, it is beneficial to increase a number of thin film transistors, thereby improving the resolution of the display panel.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

Currently, because an active layer of a vertical thin film transistor extends in a thickness direction of the array substrate, the vertical thin film transistor occupies a small space in the horizontal direction. By utilizing a feature that vertical thin film transistor occupied less horizontal space, a number of thin film transistors per unit area in a horizontal direction can be increased. However, there is no corresponding design in the prior art for how a plurality of vertical thin film transistors are disposed in an array on a substrate. Therefore, achieving array arrangement of vertical thin film transistors is a technical problem that needs to be solved.

To solve this problem, the present application disposes the first thin film transistor layer on the substrate, at least one first opening penetrates the first thin film transistor layer. The first thin film transistor layer includes a plurality of first thin film transistors disposed at intervals. The first thin film transistor includes a first electrode, a second electrode, a first active pattern, and a first gate electrode. The first electrode has a first sidewall, the second electrode has a second sidewall, and the first active pattern extends in a thickness direction of the array substrate. The first gate electrode extends in the thickness direction of the array substrate and is positioned at a side of the first active pattern away from the first electrode and the second electrode in the thickness direction of the array substrate. The first electrodes and the second electrodes of at least two of the first thin film transistors are disposed around one first opening. One first opening includes at least two of first sidewalls of the first electrode of the first thin film transistor and at least two second sidewalls of the second electrode of the first thin film transistor. The present application makes the vertical first thin film transistor disposed in an array, by combining the advantages of vertical thin film transistors that occupy a small horizontal space, it is beneficial to increase a number of thin film transistors, thereby improving the resolution of the display panel.

Figure 1:
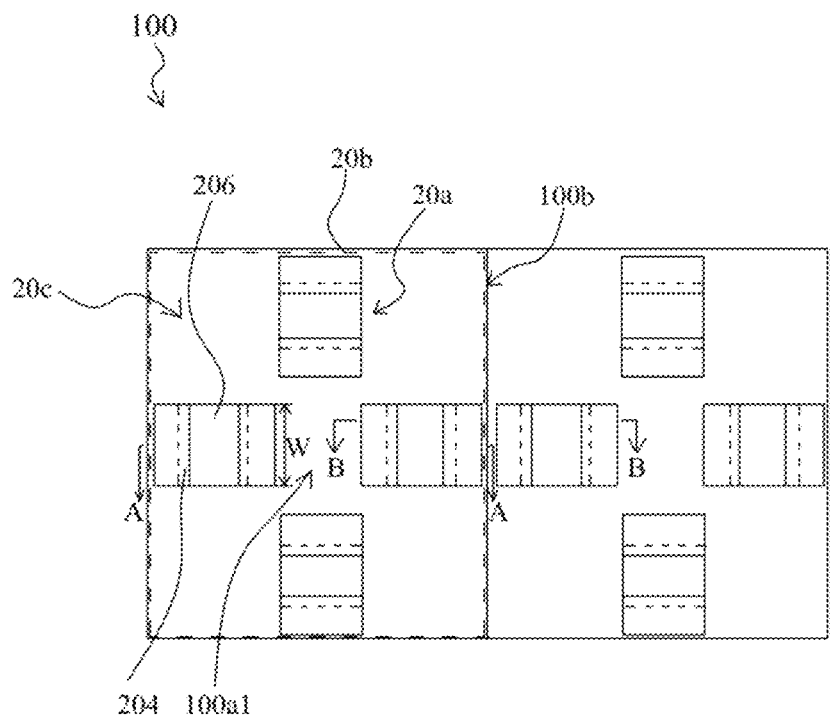
FIG. 1 is a top view of an array substrate according to first embodiment of the present application.
Figure 2:
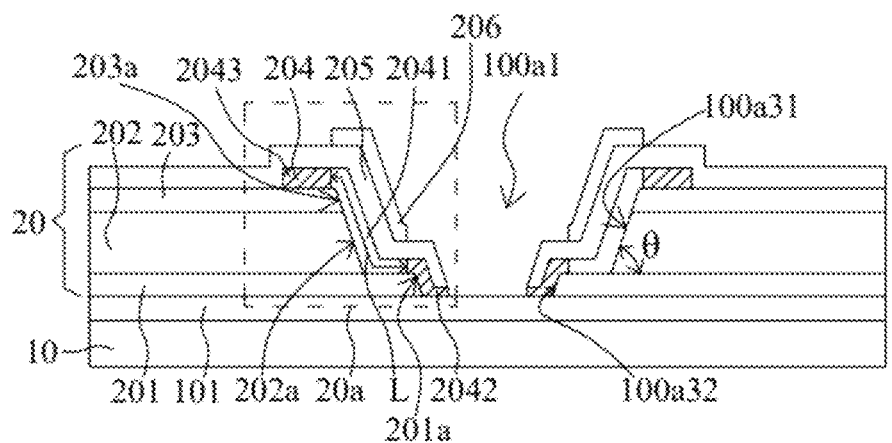
FIG. 2 is a schematic cross-sectional view along an A-A section line of the array substrate shown in FIG. 1.
Figure 3:
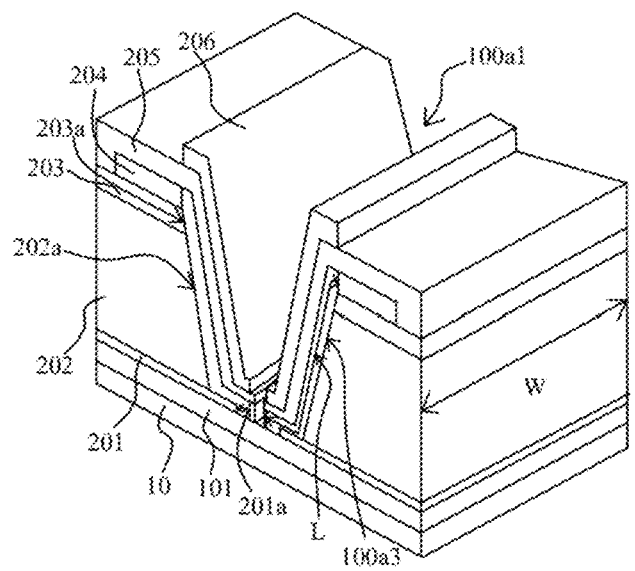
FIG. 3 is a three-dimensional schematic diagram along the A-A section line of the array substrate shown in FIG. 1.
Figure 4:
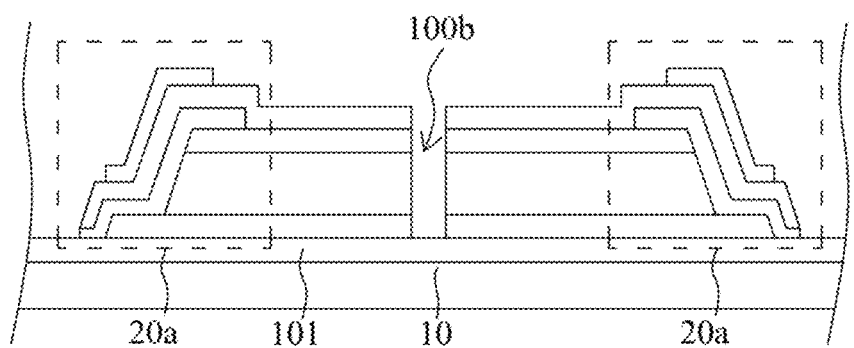
FIG. 4 is a schematic cross-sectional view along a B-B section line of the array substrate shown in FIG. 1.

Please refer to FIGS. 1 to 4. FIG. 1 is a top view of the array substrate according to the first embodiment of the present application. FIG. 2 is a schematic cross-sectional view along an A-A section line of the array substrate shown in FIG. 1. FIG. 3 is a three-dimensional schematic diagram along the A-A section line of the array substrate shown in FIG. 1. FIG. 4 is a schematic cross-sectional view along a B-B section line of the array substrate shown in FIG. 1. The array substrate 100 can be applied to a display panel such as a liquid crystal display panel, an organic light emitting diode display panel, a micro light emitting diode display panel, or a sub-millimeter light emitting diode display panel. The array substrate 100 can also be applied to active backlight modules. The array substrate 100 includes a substrate 10, a buffer layer 101, a first thin film transistor layer 20, at least one first hole 100a1, and at least one first opening 100a3.

The first thin film transistor layer 20 is disposed on the substrate 10. At least one first opening 100a3 and at least one first hole 100a1 both penetrate the first thin film transistor layer 20. At least one first hole 100a1 and at least one first opening 100a3 are disposed one to one.

In this embodiment, the substrate 10 is a glass substrate. It can be understood that the substrate 10 may also be a flexible substrate, such as a polyimide layer.

In this embodiment, the buffer layer 101 is disposed on the substrate 10, and the buffer layer 101 is configured to prevent impurities in the substrate 10 from diffusing into the first thin film transistor layer 20 to affect an electrical performance of the first thin film transistor 20a. The buffer layer 101 includes at least one of a silicon oxide layer or a silicon nitride layer. A thickness of the buffer layer 101 ranges from 300 nanometers to 600 nanometers. Specifically, the buffer layer 101 is a silicon oxide layer.

In this embodiment, the first thin film transistor layer 20 is disposed on the buffer layer 101, and the first thin film transistor layer 20 includes a plurality of first thin film transistors 20a disposed at intervals. The plurality of first thin film transistors 20a include a plurality of first thin film transistor groups 20b. Each of the first thin film transistor groups is composed of at least two of the first thin film transistors 20a disposed corresponding to one first opening 100a1. Each first thin film transistor 20a is vertical thin film transistor.

Specifically, as shown in FIGS. 1 and 2, each first thin film transistor group 20b includes four first thin film transistors 20a disposed at intervals around one first hole 100a. The four first thin film transistors 20a disposed around one first hole 100a1 are disposed symmetrically with a center. A rotation angle between any two adjacent first thin film transistors 20a in each first thin film transistor group 20b is 90 degrees. It can be understood that each first thin film transistor group 20b may also include two, three, five or six first thin film transistors 20a disposed around the first hole 100a1.

In this embodiment, the array substrate further includes at least two disconnected portions 20c. The at least two disconnected portions 20c penetrate through the first thin film transistor layer 20. Among the at least two first thin film transistors 20a disposed around one first hole 100a1, a disconnection portion 20c is provided between any two adjacent first thin film transistors 20a, to make any two adjacent first thin film transistors 20a provided around one first hole 100a1 are electrically insulated from each other. The disconnection portion 20c between the plurality of first thin film transistors 20a in each first thin film transistor group 20b is disposed around one first hole 100a1 and communicates with the first hole 100a1.

Specifically, when each first thin film transistor group 20b includes four first thin film transistors 20a disposed at intervals around one first hole 100a1, a number of the disconnected portions 20c is four. The four disconnected portions 20c are disposed around one first hole 100a1 and communicate with the first hole 100a1.

In this embodiment, as shown in FIGS. 1 and 4, any one of the first thin film transistor groups 20b is provided with an annular groove 100b penetrating through the first thin film transistor layer 20 and surrounding a periphery of the first thin film transistor group 20b, to make two adjacent first thin film transistors 20a in two adjacent first thin film transistor groups 20b are electrically insulated. A shape of the annular groove 100b is rectangular.

In this embodiment, each first thin film transistor 20a includes a first electrode 201, a first insulating layer 202, a second electrode 203, a first active pattern 204, a second insulating layer 205, and a first gate electrode 206. The plurality of first electrodes 201 of the plurality of first thin film transistors 20a are disposed in a same layer. The plurality of second electrodes 203 of the plurality of first thin film transistors 20a are disposed in a same layer. The first insulating layers 202 of the plurality of first thin film transistors 20a are disposed in a same layer. The first active patterns 204 of the first thin film transistors 20a are disposed in a same layer. The first gates 206 of the plurality of first thin film transistors 20a are disposed in a same layer. The second insulating layers 205 of the plurality of first thin film transistors 20a are disposed in a same layer. Therefore, a plurality of vertical first thin film transistors 20a can be manufactured in an array through a same manufacturing process.

It should be noted that the plurality of different members provided in a same layer refer to the plurality of different members can be manufactured by patterning a same film layer. For example, the first electrodes 201 of the plurality of first thin film transistors of the present application are provided in a same layer. It means that the plurality of first electrodes 201 are obtained by patterning a same metal film layer. The arrangement of the first insulating layers 202 of the plurality of first thin film transistors 20a in the same layer refers to the plurality of first insulating layers 202 obtained by patterning the same insulating layer.

In this embodiment, the first electrode 201 is disposed between the second electrode 203 and the substrate 10, and one terminal of the first electrode 201 close to the first hole 100a1 has a first sidewall 201a, wherein the first sidewall 201a is an inclined plane. The first electrode 201 is one of a source electrode or a drain electrode. A manufacturing material of the first electrode 201 is selected from at least one of molybdenum, aluminum, titanium, and copper. A thickness of the first electrode 201 ranges from 3000 to 8000 angstroms. It can be understood that the first electrode 201 and the second electrode 203 may also be provided in a same layer.

Specifically, the first electrode 201 is disposed on the buffer layer 101, the first electrode 201 is a source electrode, and the first electrode 201 is composed of two aluminum layers and a titanium layer positioned between the aluminum layers.

In this embodiment, the first insulating layer 202 is disposed between the first electrode 201 and the second electrode 203. One terminal of the first insulating layer 202 close to the first hole 100a1 has a third sidewall 202a. The first insulating layer 202 includes at least one of a silicon nitride layer or a silicon oxide layer. A thickness of the first insulating layer 202 ranges from 0.8 micrometers to 1.2 micrometers.

Specifically, the first insulating layer 202 is disposed on the first electrode 201 and exposes a portion of the first electrode 201. An exposed portion of the first electrode 201 extends outward from a terminal of the first insulating layer 202 having the third sidewall 202a.

The third sidewall 202a is an inclined plane, and a slope 8 of the third sidewall 202a is greater than 0 degrees and less than 90 degrees, so as to form a continuous first active pattern 204 on the third sidewall 202a. For example, the slope 8 of the third sidewall 202a is 5 degrees, 10 degrees, 15 degrees, 20 degrees, 35 degrees, 40 degrees, 45 degrees, 50 degrees, 55 degrees, 60 degrees, 70 degrees, or 75 degrees.

Further, the slope 8 of the third sidewall 202a is greater than or equal to 30 degrees and less than or equal to 80 degrees, to ensure that the thickness of the first active pattern 204 on the third sidewall 202a is uniform, and prevent the channel of the first active pattern 204 formed on the third sidewall 202a from being doped to cause increased leakage current problem.

In this embodiment, the second electrode 203 is disposed on the first insulating layer 202, and one terminal of the second electrode 203 close to the first hole 100a1 has a second sidewall 203a, wherein the second sidewall 203a is an inclined plane. The second electrode 203 is the other of the source electrode or the drain electrode. A manufacturing material of the second electrode 203 is selected from at least one of molybdenum, aluminum, titanium, and copper. A thickness of the second electrode 203 ranges from 300 angstroms to 8000 angstroms.

Specifically, the second electrode 203 is a drain electrode. The second electrode 203 is composed of two aluminum layers and a titanium layer positioned between the aluminum layers. The second sidewall 203a and the third sidewall 202a are coplanar, so as to form a continuous and uniform first active pattern 204 along the third sidewall 202a and the second sidewall 203a. In addition, a first step is formed between the second electrode 203 and the exposed portion of the first electrode 201.

In this embodiment, the first active pattern 204 extends in the thickness direction of the array substrate 100. A portion of the first active pattern 204 is positioned on the first sidewall 201a, the second sidewall 203a, and the third sidewall 202a. The first active pattern 204 includes a first channel 2041, a first doped portion 2042, and a second doped portion 2043. The first channel 2041 is connected between the first doped portion 2042 and the second doped portion 2043. At least portion of the first doped portion 2042 extends on the first sidewall 201a of the first electrode 201, the second doped portion 2043 is disposed on a surface of the second electrode 203 away from the first electrode 201. At least part of the first channel 2041 extends on the third sidewall 202a of the first insulating layer 202 and the second sidewall 203a of the second electrode 203. A manufacturing material of the first active pattern 204 includes any one of metal oxide, polysilicon, and amorphous silicon. The first active pattern 204 is formed by chemical deposition.

Specifically, the first channel 2041 extends from the exposed portion of the first electrode 201 along the third sidewall 202a and the second sidewall 203a to the surface of the second electrode 203 away from the first electrode 201. That is, the portion of the first channel 2041 is disposed along the coplanar second sidewall 203a and the third sidewall 202a, and another portion of the first channel 2041 is respectively disposed on the surface of the first electrode 201 away from the substrate 10 and the surface of the second electrode 203 away from the substrate 10. The first doped portion 2042 extends from the buffer layer 101 along the first sidewall 201a of the first electrode 201 to the surface of the first electrode 201 away from the buffer layer 101. That is, the first doped portion 2042 is disposed on a surface of the first electrode 201, and is disposed on the first side wall 201a of the first electrode 201, and the buffer layer 101. The second doped portion 2043 is disposed on the surface of the second electrode 203 away from the first electrode 201. A material of the first active pattern 204 is metal oxide, for example, indium gallium zinc oxide.

In this embodiment, as shown in FIGS. 1 and 2, an orthographic projection of the first active pattern 204 on the substrate 10 is a rectangle. A width of the first channel 2041 of the first active pattern 204 is W, and a length of the first channel 2041 of the first active pattern 204 is L. A ratio of the width W of the first channel 2041 to the length L of the first channel 2041 is greater than or equal to 1 and less than or equal to 20. For example, the ratio of the width W of the first channel 2041 to the length L of the first channel 2041 is 2, 3, 4, 5, 6, 7, 8, 9, and 12. The width W of the first channel 2041 is greater than or equal to 2 micrometers and less than or equal to 10 micrometers.

In this embodiment, the second insulating layer 205 is a gate insulating layer, at least a portion of the second insulating layer 205 extends in the thickness direction of the array substrate 100. At least portion of the second insulating layer 205 is disposed between the first active pattern 204 and the first gate electrode 206. The second insulating layer 205 is an inorganic insulating layer formed by chemical deposition, wherein the inorganic insulating layer includes at least one of a silicon oxide layer or a silicon nitride layer. A thickness of the second insulating layer 205 ranges from 1000 angstroms to 1500 angstroms. The second insulating layer 205 may also be an organic insulating layer.

Specifically, the second insulating layer 205 extends from the first doped portion 2042 of the first active pattern 204 along the first channel 2041 and the second doped portion 2043 to the second electrode 203. The second insulating layer 205 covers the second electrode 203. That is, the second insulating layer 205 covers the first active pattern 204 and the second electrode 203.

In this embodiment, the first gate electrode 206 extends in the thickness direction of the array substrate 100. The first gate electrode 206 is positioned on a side of the first active pattern 204 away from the first electrode 201 and the second electrode 203 in a direction perpendicular the thickness direction of the array substrate 100. A manufacturing material of the first gate electrode 206 is selected from at least one of molybdenum, aluminum, titanium, copper, and silver. Specifically, the first gate electrode 206 extends along a portion of the second insulating layer 205 in the first hole 100a1 to a surface of the second insulating layer 205 away from the second electrode 203.

An orthographic projection of the first gate electrode 206 on the substrate 10 is rectangular. In the direction perpendicular to the thickness direction of the array substrate 100, the first doped portion 2042 and the second doped portion 2043 are respectively positioned on opposite sides of the first gate electrode 206. The orthographic projection of the first gate electrode 206 on the substrate 10 completely coincides an orthographic projection of the first channel 2041 on the substrate 10.

It should be noted that, in this embodiment, the first gate electrode 206 is used as a mask to dope the first active pattern 204. A portion of the first active pattern 204 blocked by the first gate electrode 206 is undoped to form a first channel 2041. A portion of the first active pattern 204 not blocked by the gate electrode 206 is doped to form a first doped portion 2042 and a second doped portion 2043.

In this embodiment, the first opening 100a3 is defined by penetrating film layers including the first electrode 201, the first insulating layer 202, and the second electrode 203. One first thin film crystal group 20b is provided corresponding to one first opening 100a3. The first electrodes 201, the first insulating layers 202, and the second electrodes 203 of the at least two first thin film transistors 20a disposed around a same first hole 100a1 are disposed around one first opening 100a3. One first opening 100a3 includes at least two first side walls 201a of the first electrode 201 of the first thin film transistor 20a, the second side wall 203a of the second electrode 203, and the third side wall 202a of the first insulating 202 layer. At least two disconnected portions 20c provided around one first hole 100a1 are provided around one first opening 100a3 and communicate with one first opening 100a3.

Specifically, the first opening 100a3 includes a first sub-opening 100a31 and a second sub-opening 100a32. The first sub-opening 100a31 communicates with the second sub-opening 100a32. The first sub-opening 100a31 is positioned on a side of the second sub-opening 100a32 away from the substrate 10. A size of the second sub-opening 100a32 is smaller than a size of the first sub-opening 100a31. The first sub-opening 100a31 is defined by penetrating a film layer formed the second electrode 203 and the first insulating layer 202. The second sub-opening 100a32 is defined by penetrating a film layer formed the first electrode 201. At least two of the second electrodes 203 of the first insulating layer 202 and the first insulating layer 202 are disposed around the first sub-opening 100a31. The first sub-opening 100a31 includes the second side wall 203a of the second electrode 203 and the third side wall 202a of the first insulating layer 202. The first electrodes 201 of at least two first thin film transistors 20a surrounds the second sub-opening 100a32, and the second sub-opening 100a32 includes the first side wall 201a of the first electrode 201. The first sub-opening 100a31 and the second sub-opening 100a32 are both inverted prism-shaped.

It should be noted that the first hole 100a1 is defined by sequentially manufacturing a semiconductor layer, a gate insulating layer, and a gate metal layer in the first opening 100a3, and patterning the semiconductor layer, the gate insulating layer, and the gate metal layer respectively to obtain the first active pattern 204, the second insulating layer 205, and the first gate electrode 206. That is, the first hole 100a1 is formed by manufacturing a patterned film in the first opening 100a3.

In this embodiment, the first hole 100a1 can also be filled with organic materials, so that a surface of the array substrate 100 becomes flat, which facilitates the arrangement of the light-emitting element on the array substrate and realizing electrical connection between the light-emitting element and the first thin film transistor 20a. A cross-section of the first hole 100a1 is a square, and a side length of the square is greater than or equal to 2 micrometers, to adapt to a process accuracy of the array substrate.

This embodiment adopts a design includes two or more vertical first thin film transistors surround a first hole, which facilitates adopting a same manufacturing process and simultaneous disposing a plurality of vertical first thin film transistors in an array. The first thin film transistor is combined with the vertical type to make full use of the space in the thickness direction of the array substrate and occupies a smaller space in a horizontal direction, which is beneficial to increase a number of thin film transistors, thereby improving a resolution of the display panel including the array substrate.

Figure 5:
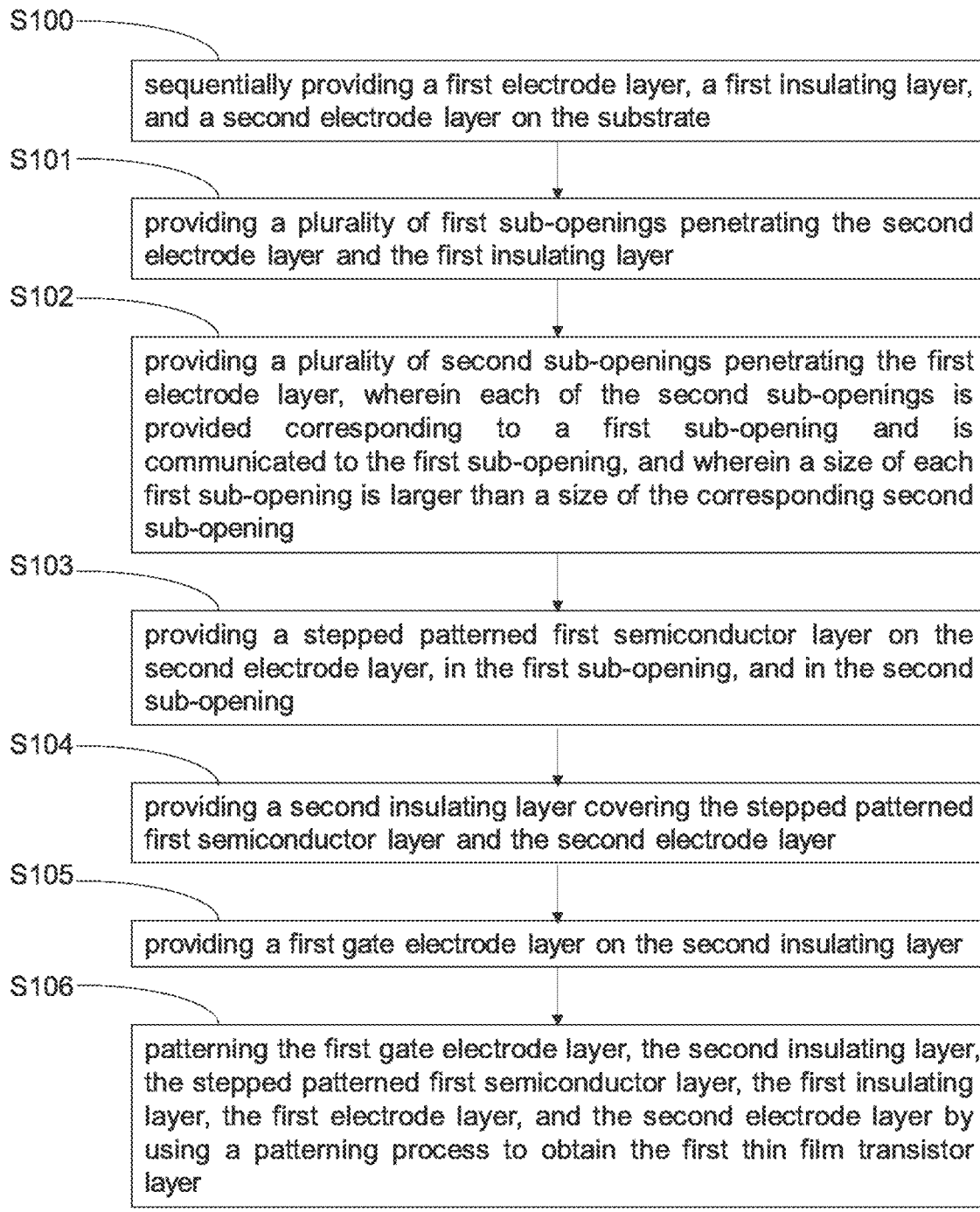
FIG. 5 is a schematic diagram of a process of manufacturing the array substrate shown in FIG. 1.

Please refer to FIG. 5, FIG. 5 is a schematic diagram of a process of manufacturing the array substrate shown in FIG. 1. The manufacturing method includes the following steps:

Step S100: sequentially providing a first electrode layer, a first insulating layer, and a second electrode layer on the substrate.

Figure 6A:
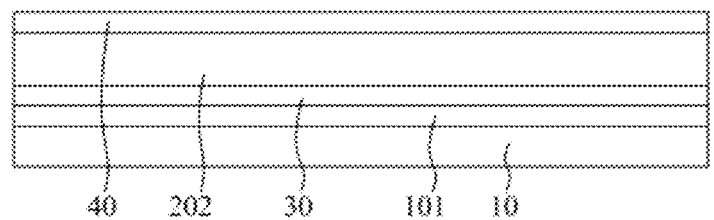
FIGS. 6A to 6J are schematic diagrams of the process of manufacturing the array substrate shown in FIG. 1.

Specifically, the step S100 includes providing a substrate 10, providing an entire buffer layer 101 on the substrate 10 by chemical deposition, providing an entire first electrode layer 30 on the buffer layer 101 by physical deposition, providing an entire first insulating layer 202 by chemical deposition on the first electrode layer 30, and providing an entire second electrode layer 40 on the first insulating layer 202 by physical deposition, as shown in FIG. 6A.

Step S101: providing a plurality of first sub-openings penetrating the second electrode layer and the first insulating layer.

Figure 6B:
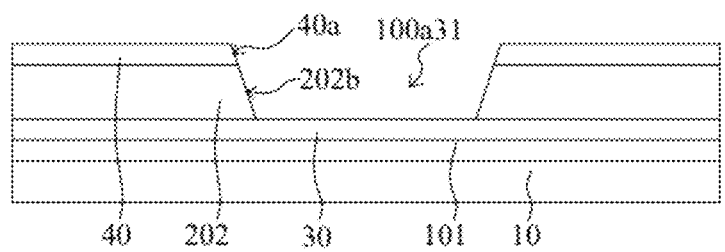
Figure 6C:
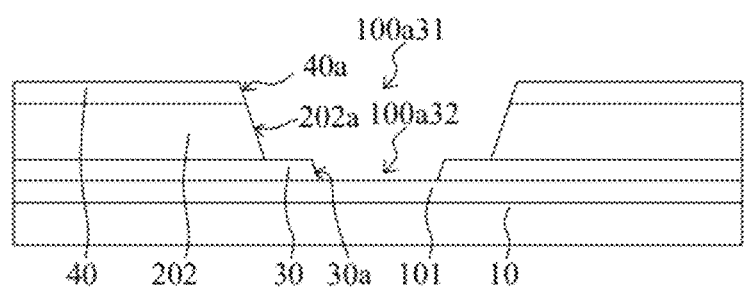

Specifically, a plurality of first sub-openings 100a31 penetrating through the second electrode layer 40 and the first insulating layer 202 are defined by using a traditional yellow light providing process and an etching process. The first sub-opening 100a31 is in a shape of an inverted quadrangular pyramid, and a longitudinal section of the first sub-opening 100a31 is in a shape of an inverted trapezoid, as shown in FIG. 6B.

In this step, by providing the first sub-opening 100a31, the first insulating layer 202 has a third annular side wall 202b surrounding the first sub-opening 100a31. The second electrode layer 40 has a second annular side wall 40a surrounding the second sub-opening 100a31. The third annular side wall 202b and the second annular side wall are coplanar. The first sub-opening 100a31 is enclosed by the second annular side wall 40a and the third annular side wall 202b. A slope of the third annular side wall 202b and a slope of the second annular side wall 40a are both greater than 0 degrees and less than 90 degrees. In a case that the slope of the third annular side wall 202b and the slope of the second annular side wall 40a are both greater than or equal to 30 degrees and less than or equal to 80 degrees, which is beneficial to manufacture a continuous first semiconductor layer on the third annular side wall 202b and the second annular side wall and the thickness of the first semiconductor layer is uniform, which is also beneficial to appropriately doping the first semiconductor layer to avoid excessive doped regions and large leakage current.

Step S102: providing a plurality of second sub-openings penetrating the first electrode layer, wherein each of the second sub-openings is provided corresponding to a first sub-opening and is communicated to the first sub-opening, and wherein a size of each first sub-opening is larger than a size of the corresponding second sub-opening.

Specifically, the second sub-opening 100a32 which penetrating through the first electrode layer 30 is manufactured by using a traditional yellow light process and etching process. By providing the second sub-opening 100a32, the first electrode layer 30 has a first annular side wall 30a, and the second sub-opening 100a32 is enclosed by the first annular side wall 30a. The second sub-opening 100a32 is disposed corresponding to the first sub-opening 100a31. The first sub-opening 100a31 is communicated with the second sub-opening 100a32. A size of the first sub-opening 100a31 is larger than a size of the second sub-opening 100a32. The second sub-opening 100a32 is in a shape of an inverted quadrangular pyramid, and a longitudinal section of the second sub-opening 100a32 is in a shape of an inverted trapezoid.

In this step, by providing the second sub-opening 100a32, and the size of the second sub-opening 100a32 is smaller than the size of the first sub-opening 100a31, the first insulating layer 202 exposes a portion of the first electrode layer 30. A first step is formed between the exposed portion of the first electrode layer 30 and the second electrode layer 40.

Step S103: providing a stepped patterned first semiconductor layer on the second electrode layer, in the first sub-opening, and in the second sub-opening.

Figure 6D:
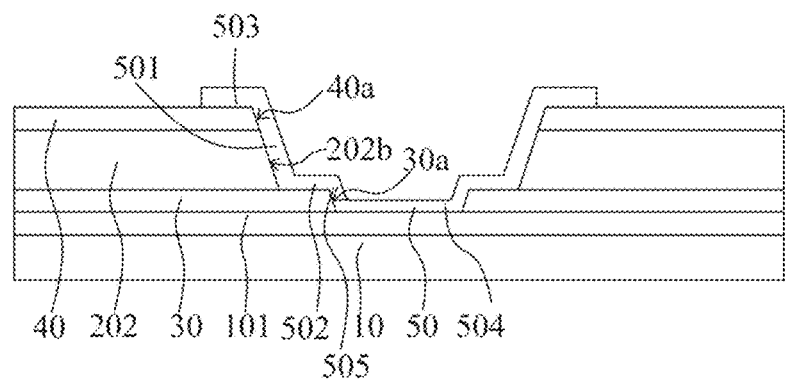

Specifically, using chemical deposition to form the entire surface of the first semiconductor layer on the surface of the second electrode layer 40 away from the first insulating layer 202, the second annular side wall 40a of the second electrode layer 40, the third annular side wall 202b of the first insulating layer 202, the exposed portion the first electrode layer 30 and the buffer layer 101. Using yellowing process and an etching process to pattern the entire surface of the first semiconductor layer, to remove a portion of the first semiconductor layer on the second electrode layer 40 to obtain a stepped patterned first semiconductor layer 50. The stepped patterned first semiconductor layer 50 extends from the buffer layer 101 in the second sub-opening along the first annular side of the first electrode layer 30 to the surface of the first electrode layer 30 away from the substrate 10, and then extends along the third annular side wall 202b and the second annular side wall 40a to the surface of the second electrode layer away from the first insulating layer 202, such as Shown in FIG. 6D.

In this step, the stepped patterned first semiconductor layer 50 includes a first inclined active layer 501 disposed along the third annular side wall 202b and the second annular side wall 40a, a second inclined active layer 505 disposed along the first annular side wall 30a, a first horizontal active layer 502 disposed on a surface of the first electrode layer 30, a second horizontal active layer 503 disposed on the surface of the second electrode 40, and a third horizontal active layer 504 disposed on the buffer layer 101. The first horizontal active layer 502 and the second horizontal active layer 503 are respectively connected to opposite sides of the first inclined active layer 501. The third horizontal active layer 504 and the first horizontal active layer 502 are respectively connected to opposite sides of the second inclined active layer 505. The patterned first semiconductor layer 50 is stepped and extends in the thickness direction of the array substrate, which is beneficial to save an occupied surface by the first thin film transistor in the horizontal direction.

Step S104: providing a second insulating layer covering the stepped patterned first semiconductor layer and the second electrode layer.

Figure 6E:
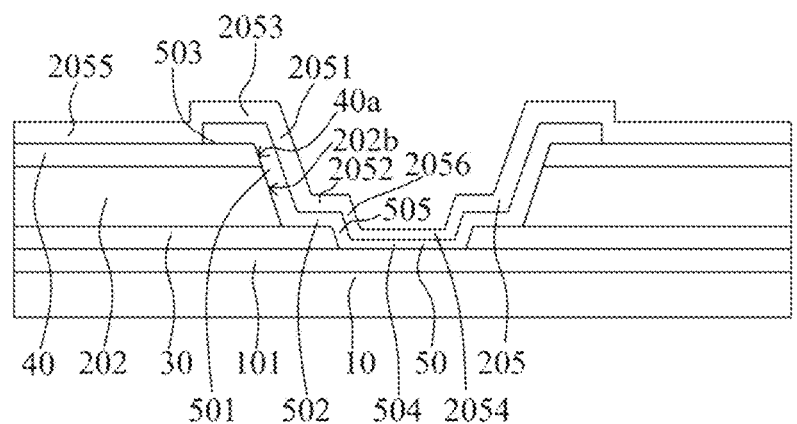

Specifically, chemical vapor deposition is used to form the entire surface of the second insulating layer 205 on the stepped patterned first semiconductor layer 50 and the second electrode layer 40, as shown in FIG. 6E.

In this step, a portion where the second insulating layer 205 covers the stepped patterned first semiconductor layer 50 is also stepped. The second insulating layer 205 includes a first inclined insulating layer 2051 disposed along the first inclined active layer 501, a second inclined insulating layer 2056 disposed along the second inclined active layer 505, a first horizontal insulating layer 2052 disposed on the first horizontal active layer. 502, a second horizontal insulating layer 2053 disposed on the second horizontal active layer 503, a third horizontal insulating layer 2054 disposed on the third horizontal active layer 504, and a fourth horizontal insulating layer 2055 disposed on the second electrode layer 40. The first horizontal insulating layer 2052 and the second horizontal insulating layer 2053 are connected to opposite sides of the first inclined insulating layer 2051. The fourth horizontal insulating layer 2055 is connected to a side of the second horizontal insulating layer 2053 away from the first inclined insulating layer 2051. The third horizontal insulating layer 2054 and the first horizontal insulating layer 2052 are respectively connected to opposite sides of the second inclined insulating layer 2056. The second horizontal insulating layer 2053, the first inclined insulating layer 2051, the second inclined insulating layer 2056, the second inclined insulating layer 2056, the first horizontal insulating layer 2052, and the third horizontal insulating layer 2054 constitute a stepped portion of the second insulating layer 205.

Step S105: providing a first gate electrode layer on the second insulating layer.

Figure 6F:
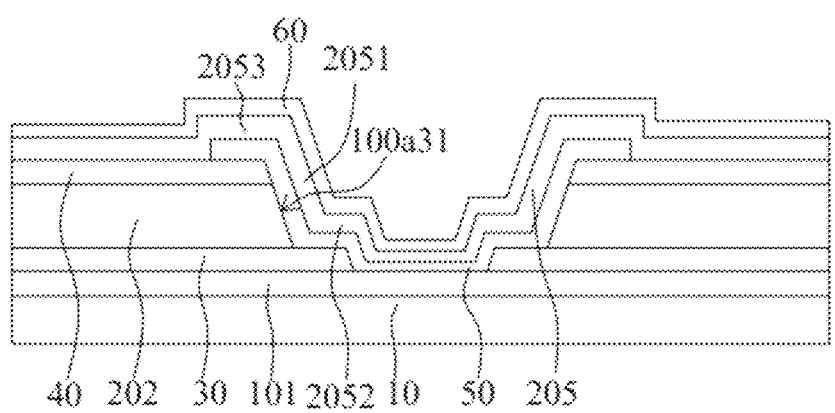

Specifically, the entire surface of the first gate electrode layer 60 is manufactured by physical deposition on the second insulating layer 205, as shown in FIG. 6F.

Step S106: patterning the first gate electrode layer, the second insulating layer, the stepped patterned first semiconductor layer, the first insulating layer, the first electrode layer, and the second electrode layer by using a patterning process to obtain the first thin film transistor layer.

Figure 6G:
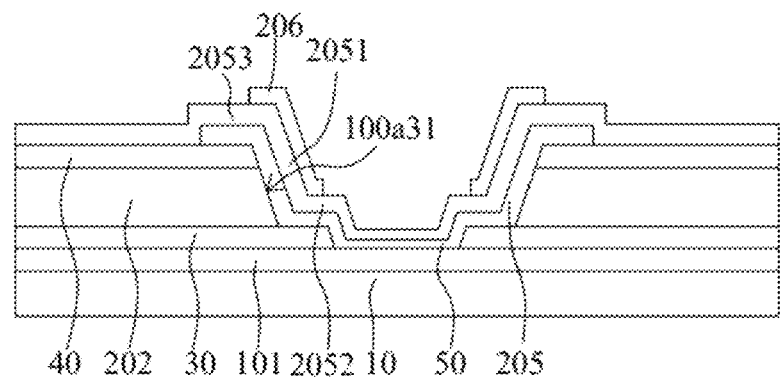

First, the first gate electrode layer 60 is patterned by yellow light process and etching process to obtain a plurality of first gate electrodes 206. At least two first gate electrodes 206 are disposed corresponding to one first sub-opening 100a31 and are distributed in an annular shape. A portion of at least two first gate electrodes 206 provided corresponding to one first sub-opening 100a31 is positioned in the first sub-opening 100a31. Each first gate electrode 206 extends from the first horizontal insulating layer 2052 along the first inclined insulating layer 2051 to the second horizontal insulating layer 2053, as shown in FIG. 6G. An orthographic projection of each first gate electrode 206 on the substrate 10 is rectangular. For example, when a number of first gates 206 provided corresponding to one first sub-opening 100a31 is four, the four first gate electrodes 206 are distributed in an annular shape and are disposed symmetrically. A rotation angle between two adjacent first gate electrodes 206 is 90 degrees.

Secondly, the second insulating layer 205 and the stepped patterned first semiconductor layer 50 are sequentially etched by the yellow light process and the etching process to obtain a plurality of first active patterns 204 and a plurality of first holes 100a1. At least two of the first active pattern 204 are disposed around one first hole 100a1. Each first active pattern 204 is disposed corresponding to one first gate electrode 206. An orthographic projection of each first active pattern 204 on the substrate 10 is a rectangle, and an orthographic projection of the first gate electrode 206 on the substrate 10 is positioned correspondingly to the first active pattern 204 in an orthographic projection on the substrate 10. Each first hole 100a1 is provided by providing a plurality of first active patterns 204, a plurality of first gate electrodes 206, and a patterned second insulating layer 205 in the first sub-opening 100a31. Each first hole 100a1 penetrates the first gate electrode layer 60, the second insulating layer 205, the stepped patterned first semiconductor layer 50, the second electrode layer 40, the first insulating layer 202, and the first electrode layer 30.

Figure 6H:
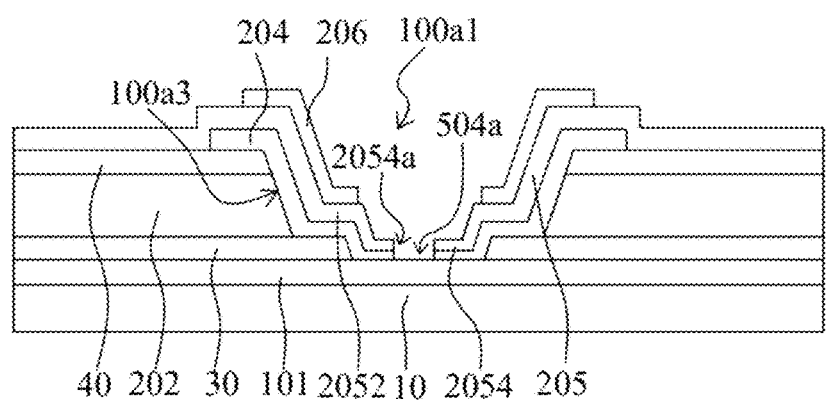
Figure 6I:
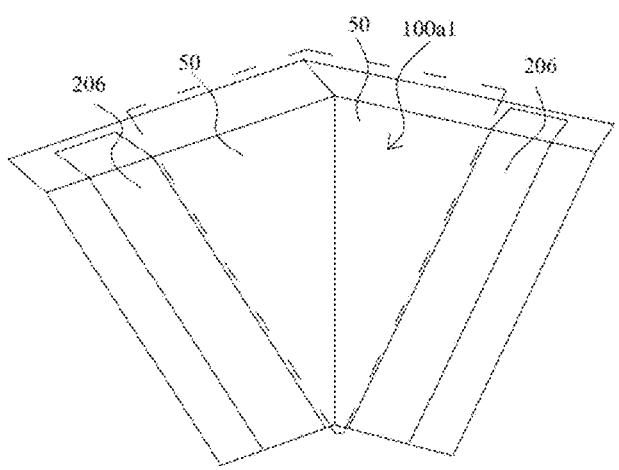
Figure 6J:
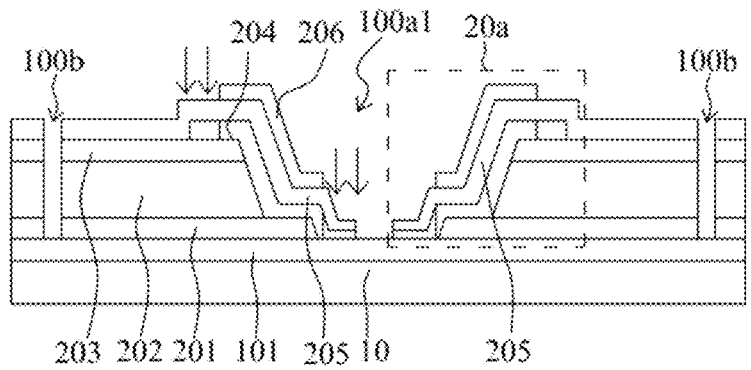

Specifically, forming a first through hole 2054a penetrating through the third horizontal insulating layer 2054, and forming a second through hole 504a penetrating through the third horizontal active layer 504. The second through hole 504a and the first through hole 2054a are in communication with each other with a same size, wherein a plurality of first holes 100a1 are obtained, as shown in FIG. 6H. Etching the second insulating layer 205 between two adjacent first gates 206 and the stepped patterned semiconductor layer 50 first holes 206 provided corresponding to the first opening 100a3 (as in the patterned first semiconductor layer 50 in the dashed frame), a plurality of first active patterns 204 are obtained, as shown in FIG. 6I Next, etching the first electrode layer 30 and the second electrode layer 40 by a yellow light process and an etching process to obtain a plurality of first electrodes 201 and a plurality of second electrodes 203, as shown in FIG. 6J. The step of etching the first electrode layer 30 and the second electrode layer 40 by the yellow light process and an etching process includes: forming an annular groove 100b penetrating a second insulating layer 205, a second electrode layer 40, a first insulating layer 202, and a first electrode layer 30, wherein the annular groove 100b is annular and is disposed around at least two first active patterns disposed around one first hole 100a1, and then obtaining a plurality of first electrodes 201 and a plurality of second electrodes 203 disposed around one first hole 100a1 by etching the first electrode layer 30, the second electrode layer 40, and the first insulating layer 202 between two adjacent first active patterns which surrounding the first hole 100a1.

Finally, as shown in FIG. 6J, doping the plurality of first active patterns 204 with the first gate electrode 206 as a mask to obtain a plurality of first thin film transistor groups wherein each first thin film transistor group 20b includes at least two first thin film transistors 20a are provided surrounding one first hole 100a1. The annular groove 100b is provided around the first thin film transistor group 20b. Each first thin film transistor 20a includes a first electrode 201, a second insulating layer 202 positioned on the first electrode 201, a second electrode 203 positioned on the first insulating layer 202, a first active pattern 204 extending along the side wall of a first electrode 201, the sidewall of the first insulating layer 202, and the sidewalls of the second electrode 203, a first gate electrode 206 corresponding to the first active pattern 204, and a second insulating layer 205 positioned between the first gate electrode 206 and the first active pattern 204.

The manufacturing method of the array substrate of this embodiment adopts the same manufacturing process to manufacture a plurality of first thin film transistor groups. Each thin film transistor group includes at least two vertical first thin film transistors disposed around the first hole. The vertical first thin film transistor includes a first electrode, a second electrode, a first insulating layer disposed between the first electrode and the second electrode, a first active pattern, a second insulating layer, and a first gate electrode, so as to be manufactured to obtain with the array substrate with a plurality of vertical thin film transistors disposed in an array, combined with the feature that the vertical first thin film transistor occupies a small horizontal space, the present disclosure is beneficial to increase the number of thin film transistors, thereby improving the resolution of the display panel including the array substrate.

Figure 7:
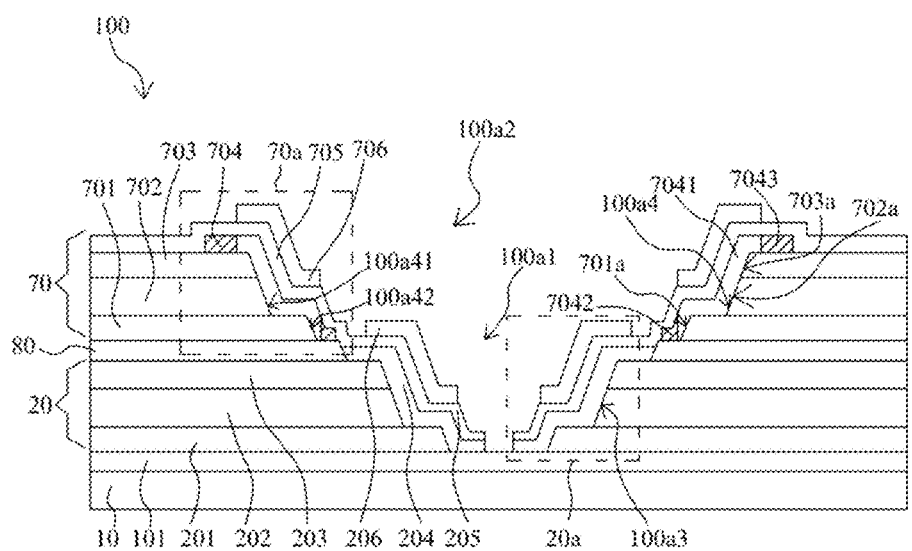
FIG. 7 is a schematic cross-sectional view of an array substrate according to second embodiment of the present application.

Please refer to FIG. 7, which is a schematic diagram of an array substrate according to a second embodiment of the present application. The array substrate shown in FIG. 7 is basically similar to the array substrate shown in FIG. 2, differences include: the array substrate shown in FIG. 7 further includes a second thin film transistor layer 70, at least one second hole 100a2, at least one second opening 100a4, and a fifth insulating layer 80. The at least one second hole 100a2 and the at least one second opening 100a4 all penetrate the second thin film transistor layer 70. The second thin film transistor layer is disposed on a side of the first thin film transistor layer 20 away from the substrate 10. The fifth insulating layer 80 is disposed between the second thin film transistor layer 70 and the first thin film transistor layer 20.

Each second thin film transistor layer 70 includes a plurality of second thin film crystals 70a disposed in a same layer. The second thin film transistors 70a are also vertical thin film transistors. At least two second thin film transistors 70a are disposed around one second hole 100a2. At least two second thin film transistors 70*a* disposed around one second hole 100*a*2 form a second thin film transistor group.

The second thin film transistor 70*a* includes a third electrode 701, a fourth electrode 703, a second active pattern 704, a third insulating layer 702, a fourth insulating layer 705, and a second gate electrode 706.

In this embodiment, the third electrode 701 has a fourth sidewall 701*a* at one terminal close to the second hole 100*a*2. The third electrode 701 is a source electrode. A thickness and a material of the third electrode 701 are the same as the thickness and the material of the first electrode 201, which will not be described in detail here.

In this embodiment, a terminal of the fourth electrode 703 close to the second hole 100*a*2 has a fifth sidewall 703 *a*, and the fourth electrode 703 is disposed on a side of the third electrode 701 away from the substrate 10. The fourth electrode 703 is a drain electrode, and a thickness and material of the fourth electrode 703 are the same as the thickness and the material of the second electrode 203, which will not be described in detail here.

In this embodiment, the third insulating layer 702 has a sixth sidewall 702*a* at one terminal close to the second hole 100*a*2. The third insulating layer 702 is disposed between the third electrode 701 and the fourth electrode 703. The thickness and the material of the third insulating layer 702 are the same as the thickness and the material of the first insulating layer 202, and will not be described in detail here. In addition, the third electrode 701 extends outward opposite to one terminal of the third insulating layer 702 including the sixth sidewall 702*a*. A second step is formed between a portion of the third electrode 701 extends outward opposite to one terminal of the third insulating layer 702 including the sixth sidewall 702*a* and a portion of the fourth electrode 703 extends outward opposite to one terminal of the third insulating layer 702 including the sixth sidewall 702*a*.

A slope of the sixth sidewall 702*a* is greater than or equal to 30 degrees and less than or equal to 80 degrees, so as to facilitate subsequent planation formation. The sixth sidewall 702*a* and the fifth sidewall 703*a* are coplanar. Specifically, the slope of the sixth sidewall 702*a* is equal to the slope of the third sidewall 202*a*.

In this embodiment, the second active pattern 704 extends in the thickness direction of the array substrate 100, and part of the second active pattern 704 is positioned on the fourth sidewall 701*a*, the fifth sidewall 703*a*, and the sixth sidewall 702*a*. The second active pattern 704 and the first active pattern 204 are obtained by patterning a same semiconductor layer. The thickness and the material of the second active pattern 704 are the same as the thickness and the material of the first active pattern 204, and will not be described in detail here.

Specifically, the second active pattern 704 extends from the fifth insulating layer 80 along the fourth sidewall 701*a* to a surface of the third electrode 701 away from the fifth insulating layer 80, and extends from the third electrode 701 along the sixth sidewall 702*a* and the fifth sidewall 703*a* to a surface of the fourth electrode 703 away from the third insulating layer 702.

The second active pattern 704 includes a second channel 7041, a third doped portion 7042, and a fourth doped portion 7043. The third doped portion 7042 and the fourth doped portion 7043 are connected to opposite terminals of the second channel 7041. In a direction perpendicular to the thickness direction of the array substrate 100, the third doped portion 7042 and the fourth doped portion 7043 are respectively positioned on opposite sides of the second gate 706.

In this embodiment, the second gate electrode 706 extends in the thickness direction of the array substrate 100. The second gate 706 is positioned in a side of the second active pattern 704 away from the third electrode 701 and the fourth electrode 703 in the direction perpendicular to the thickness direction of the array substrate 100. The second gate electrode 706 and the first gate electrode 206 are obtained by patterning a same gate metal layer. A thickness and a material of the second gate electrode 706 are the same as a thickness and a material of the first gate electrode 206, which will not be described in detail here.

In this embodiment, at least part of the fourth insulating layer 705 extends in the thickness direction of the array substrate 100, and at least part of the fourth insulating layer 705 is disposed between the second active pattern 704 and the second gate electrode 706. The fourth insulating layer 705 and the second insulating layer 205 are obtained by patterning a same insulating layer, and a thickness and a material of the fourth insulating layer 705 are the same as a thickness and a material of the second insulating layer 205, which will not be described in detail here. Specifically, the fourth insulating layer 705 covers an entire second active pattern 704 and the fourth electrode 703.

In this embodiment, the fifth insulating layer 80 includes a third opening 80*a*, and the third opening 80*a* communicates with the second opening 100*a*4 and the first opening 100*a*3. The manufacturing material of the fifth insulating layer 80 is selected from at least one of silicon nitride and silicon oxide.

In this embodiment, a number of second thin film transistors 70*a* in each second thin film transistor layer 70 is a same as a number of first thin film transistors 20*a* in each first thin film transistor layer 20. In addition, the second thin film transistors 70*a* in the second thin film transistor layer 70 and the first thin film transistors 20*a* in the first thin film transistor layer 20 are disposed in one-to-one correspondence in the thickness direction of the array substrate. The second insulating layer 205 of the first thin film transistor 20*a* is connected to the corresponding fourth insulating layer 705 of the second thin film transistor 70*a*, and the first thin film transistor 20*a* is electrically insulated from the corresponding second thin film transistor 70*a*.

In this embodiment, at least one second opening 100*a*4 and at least one first opening 100*a*3 are disposed in one-to-one correspondence, and each second opening 100*a*4 communicates with the corresponding first opening 100*a*3. The third electrodes 701, the fourth electrodes 703 and the third insulating layer 702 of at least two second thin film transistors 70*a* are disposed around one second opening 100*a*4. One second opening 100*a*4 includes the fourth sidewalls 701*a* of the third electrodes 701 of at least two second thin film transistors 70*a*, the fifth sidewalls 703*a* of the fourth electrodes 703 of at least two second thin film transistors 70*a*, and the sixth sidewalls 702*a* of the third insulating layer 702 of at least two second thin film transistors 70*a*. The second opening 100*a*4 includes a third sub-opening 100*a*41 and a fourth sub-opening 100*a*42, the third sub-opening 100*a*41 is positioned on the side of the fourth sub-opening 100*a*42 away from the substrate 10. A size of the third sub-opening 100*a*41 is larger than a size of the fourth sub-opening 100*a*42. The third sub-opening 100*a*41 and the fourth sub-opening 100*a*42 are both inverted quadrangular pyramids.

In this embodiment, the second hole 100*a*2 is formed by providing the second active pattern 704, the fourth insulating layer 705, and the second gate 706 in the second opening 100*a*4. The second opening 100*a*4 and the second hole 100a2 are disposed one to one up and down in the thickness direction of the substrate. The second hole 100a2 and the first hole 100a1 are disposed one to one up and down in the thickness direction of the array substrate. The second hole 100a2 communicates with the first hole 100a1. A size of the second hole 100a2 is larger than a size of the first hole 100a1.

It should be noted that a number of layers of the second thin film transistor layer 70 may be one or multiple, for example, 3, 4, 5, etc. An insulating layer is provided between two adjacent second thin film transistor layers 70. In addition, the first thin film transistor layer 20 and at least one second thin film transistor layer 70 can be manufactured through a same manufacturing process to manufacture a plurality of vertical thin film transistors disposed in an array while simplifying the manufacturing process.

Figure 8:
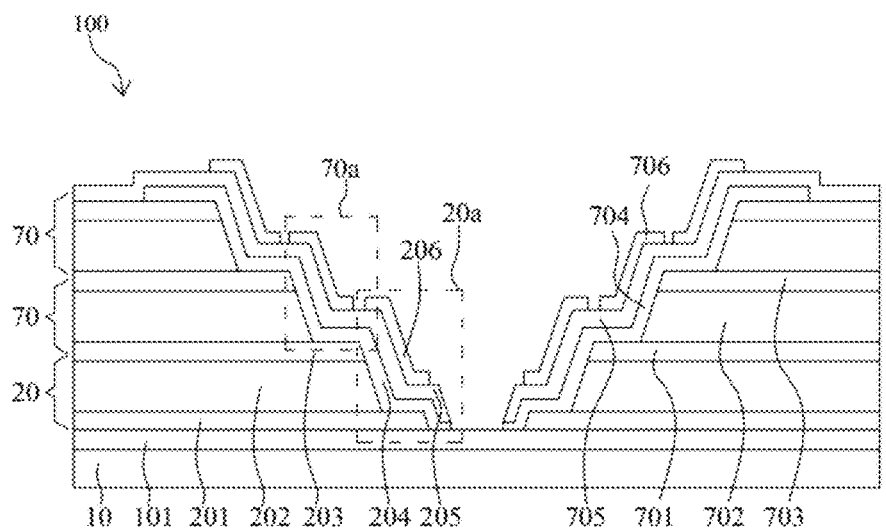
FIG. 8 is a schematic cross-sectional view of an array substrate according to third embodiment of the present application.

Please refer to FIG. 8, FIG. 8 is a schematic cross-sectional view of an array substrate according to third embodiment of the present application. The array substrate shown in FIG. 8 is basically similar to the array substrate shown in FIG. 7 except that the number of second thin film transistor layers 70 is two, and at least one first thin film transistor 20a and at least one second thin film transistor 70a are adjacent to and correspondingly disposed in the thickness direction of the array substrate, and wherein the second electrode 203 of at least one first thin film transistor 20a is multiplexed as a third electrode 701 of a second thin film transistor 70a adjacent to and corresponding to the first thin film transistor 20a.

In this embodiment, the first active pattern 204 of the first thin film transistor is connected to the second active pattern 704 of the second thin film transistor 70a provided corresponding to the first thin film transistor 20a. The second insulating layer 205 of the first thin film transistor 20a is connected to the fourth insulating layer 705 of the second thin film transistor 70a provided corresponding to the first thin film transistor 20a.

It should be noted that the second active patterns 704 of the two second thin film transistor layers 70 and the first active pattern 204 of the first thin film transistor layer in this embodiment are obtained by patterning a same semiconductor layer. The second gates 706 of the two second thin film transistor layers 70 and the first gate electrode 206 in the first thin film transistor layer 20 are obtained by patterning a same gate electrode layer. The fourth insulating layers 705 of the two second thin film transistor layers 70 and the second insulating layer 205 of one first thin film transistor layer 20 are a same insulating layer. The two second thin film transistor layers 70 and the first thin film transistor layer 20 can be obtained by a same manufacturing process, while simplifying the manufacturing process, it is beneficial to increase the number of thin film transistors, thereby improving the resolution of the display panel including the array substrate.

The present application also provides a display panel. The display panel includes any of the above-mentioned array substrates and light-emitting elements. The light-emitting elements may be liquid crystal display units, micro light-emitting diodes, sub-millimeter light-emitting diodes, or organic light-emitting diodes. The light emitting element is electrically connected with at least one first thin film transistor, and the at least one first thin film transistor controls turning on of the light emitting element. It can be understood that the light-emitting element may also be electrically connected to at least one second thin film transistor.

The descriptions of the above embodiments are only used to help understand the technical solutions and core ideas of the present application. Those of ordinary skill in the art should understand that they can still modify the technical solutions recorded in the foregoing embodiments, or modify some of the technologies. The features are equivalently replaced; and these modifications or replacements do not cause the essence of the corresponding technical solutions to deviate from a scope of the technical solutions of the embodiments of the present application.

What is claimed is:

1. An array substrate, comprising:
    a substrate; and
    a first thin film transistor layer disposed on the substrate, wherein the first thin film transistor layer comprises:
        a plurality of first thin film transistors disposed at intervals, wherein each of the first thin film transistors comprises:
            a first electrode having a first sidewall;
            a second electrode having a second sidewall;
            a first active pattern extending in a thickness direction of the array substrate; and
            a first gate electrode extending in the thickness direction of the array substrate and positioned at a side of the first active pattern away from the first electrode and the second electrode in the thickness direction of the array substrate; and
        at least one first opening penetrating the first thin film transistor layer;
    wherein the first electrodes and the second electrodes of at least two of the first thin film transistors are disposed around one first opening, and wherein each of the first openings comprises at least two of first sidewalls of the first electrode of the first thin film transistor and at least two second sidewalls of the second electrode of the first thin film transistor.

2. The array substrate according to claim 1, wherein the first electrode is disposed between the second electrode and the substrate, and wherein the first thin film transistor further comprises:
    a first insulating layer disposed between the first electrode and the second electrode, and the first insulating layer having a third sidewall; and
    a second insulating layer, wherein at least part of the second insulating layer extends in the thickness direction of the array substrate, and the at least part of the second insulating layer is disposed between the first active pattern and the first gate electrode;
    wherein the first insulating layers of at least two of the first thin film transistors are disposed around one first opening, and wherein each of the first openings further comprises the third sidewalls of the first insulating layers of the at least two first thin film transistor, and wherein a portion of the first active pattern is positioned on the third sidewall of the first insulating layer.

3. The array substrate according to claim 2, wherein the first opening comprises:
    a first sub-opening, wherein the second electrodes and the first insulating layers of at least two first thin film transistors are disposed around the first sub-opening, and wherein the first sub-opening comprises the second sidewall of the second electrode and the third sidewall of the first insulating layer, and wherein the second sidewall is coplanar with the third sidewall; and
    a second sub-opening, wherein the first electrodes of at least two of the first thin film transistors are disposed around the second sub-opening, and wherein the second sub-opening comprises the first sidewall of the first electrode, the second sub-opening communicates with the first sub-opening, and wherein a size of the second sub-opening is smaller than a size of the first sub-opening.

4. The array substrate according to claim 2, wherein a slope of the third sidewall is greater than or equal to 30 degrees and less than or equal to 80 degrees.

5. The array substrate according to claim 2, wherein the first active pattern comprises:
   a first doped portion, wherein at least part of the first doped portion extends on the first sidewall of the first electrode;
   a second doped portion disposed on a surface of the second electrode away from the first electrode; and
   a first channel connected between the first doped portion and the second doped portion, and wherein at least part of the first channel extends on third sidewall of the first insulating layer and the second sidewall of the second electrode.

6. The array substrate according to claim 5, wherein the first doped portion and the second doped portion are positioned opposite to the first gate electrode in a direction perpendicular to the thickness direction of the array substrate, and wherein an orthographic projection of the first channel on the substrate completely coincides with an orthographic projection of the first gate electrode on the substrate.

7. The array substrate according to claim 1, wherein a shape corresponding to an orthographic projection of the first active pattern on the substrate is rectangle, and a shape corresponding to an orthographic projection of the first gate electrode on the substrate is rectangular.

8. The array substrate according to claim 1, wherein the array substrate further comprises:
   at least two disconnected portions penetrating the first thin film transistor layer, and the at least two disconnected portions are disposed around one first opening and communicated with one first opening, and wherein each of the disconnected portions is positioned between two adjacent first thin film transistors, and wherein the first electrodes and the second electrodes of two adjacent first thin film transistors disposed corresponding to one first opening are disposed around one first opening.

9. The array substrate according to claim 1, comprising:
   an annular groove penetrating the first thin film transistor layer and is disposed around a first thin film transistor group, wherein the first thin film transistor group is composed of at least two first thin film transistors disposed corresponding to one first opening, and wherein the first electrodes and the second electrodes of at least two of the first thin film transistors disposed corresponding to one first opening are disposed around one first opening.

10. The array substrate according to claim 2, wherein the first electrodes of the plurality of first thin film transistors are disposed in a same layer, the second electrodes of the plurality of first thin film transistors are disposed in a same layer, the first insulating layers of the plurality of first thin film transistors are disposed in a same layer, the first active patterns of the plurality of first thin film transistors are disposed in a same layer, the first insulating layers of the plurality of first thin film transistors are disposed in a same layer, the first gate electrodes of the plurality of first thin film transistors are disposed in a same layer, and the second insulating layers of the plurality of first thin film transistors are disposed in a same layer.

11. The array substrate according to claim 2, further comprising:
   a second thin film transistor layer disposed on a side of the first thin film transistor layer away from the substrate, and comprises a plurality of second thin film transistors disposed at intervals, wherein the second thin film transistor comprises:
   a third electrode having a fourth sidewall;
   a fourth electrode having a fifth sidewall and is disposed on a side of the third electrode away from the substrate;
   a third insulating layer having a sixth sidewall and is disposed between the third electrode and the fourth electrode;
   a second active pattern extending in the thickness direction of the array substrate, wherein part of the second active pattern is positioned on the fourth sidewall, the fifth sidewall, and the sixth sidewall;
   a second gate electrode extending in the thickness direction of the array substrate and is positioned at a side of the second active pattern away from the third electrode and the fourth electrode in the thickness direction of the array substrate; and
   a fourth insulating layer, wherein at least part of the fourth insulating layer extends in the thickness direction of the array substrate, and at least part of the fourth insulating layer is disposed between the second active pattern and the second gate electrode; and
   at least one second opening penetrating the second thin film transistor layer and is disposed one-to-one with at least one first opening, wherein each of the second openings communicates with the corresponding first opening;
   wherein the third electrodes, the fourth electrodes, and the third insulating layers of at least two of the second thin film transistors are disposed around one of the second openings, and wherein one of the second openings comprises the fourth sidewalls of the third electrodes of at least two of the second thin film transistors, the fifth sidewalls of the fourth electrodes of at least two of the second thin film transistors, and the sixth sidewalls of the third insulating layers of at least two of the second thin film transistors.

12. The array substrate according to claim 11, wherein a plurality of the first thin film transistors in the first thin film transistor layer and a plurality of the second thin film transistors in the second thin film transistor layer are disposed one to one in the thickness direction of the array substrate.

13. The array substrate according to claim 12, wherein the first thin film transistor layer is disposed adjacent to the second thin film transistor layer, and wherein the second electrode of the first thin film transistor is multiplexed as the third electrode of the second thin film transistor disposed adjacent to and corresponding to the first thin film transistor.

14. The array substrate according to claim 12, wherein the first active pattern of the first thin film transistor is connected to the second active pattern of the second thin film transistor provided corresponding to the first thin film transistor, and wherein the second insulating layer of the first thin film transistor is connected to the fourth insulating layer of the second thin film transistor provided corresponding to the first thin film transistor.

15. The array substrate according to claim 11, wherein a size of the second opening is larger than a size of the corresponding first opening.

16. A display panel, comprising the array substrate according to claim 1 and a plurality of light-emitting elements, wherein the light-emitting elements are electrically connected to at least one of the first thin film transistors.

17. A method of manufacturing the array substrate according to claim 1, wherein the method comprises the following steps:
- providing a first electrode layer and a second electrode layer on the substrate;
- providing at least one opening penetrating the first electrode layer and the second electrode layer, wherein the opening comprises a first annular sidewall of the first electrode layer and a second annular sidewall of the second electrode layer;
- providing a patterned semiconductor layer at least on the first annular sidewall of the first electrode layer, the second annular sidewall of the second electrode layer, and the substrate;
- providing at least two spaced-apart first gate electrodes corresponding to one of the openings on a surface of the patterned semiconductor layer away from the first electrode layer and the second electrode layer, and wherein part of at least two spaced disposed first gate electrodes which corresponding to one opening is position in the opening;
- providing at least two disconnected portions penetrating the patterned semiconductor layer, the first electrode layer, and the second electrode layer, and wherein each of the disconnected portions is positioned between two adjacent first gate electrodes provided corresponding to one first opening, and wherein at least two of the disconnected portions are in communication with the opening, and at least two of the disconnected portions disconnecting the patterned semiconductor layer, the first electrode layer, and the second electrode layer into at least two of the first active patterns, at least two of the first electrodes, and at least two of the second electrodes respectively.

* * * * *